United States Patent
Yamaguchi et al.

[11] Patent Number: 6,107,741
[45] Date of Patent: Aug. 22, 2000

[54] CATHODE STRUCTURE FOR SHORT ARC TYPE DISCHARGE LAMP

[75] Inventors: Akiyasu Yamaguchi; Shinkichi Morimoto; Masanori Sugihara, all of Himeji, Japan

[73] Assignee: Ushiodenki Kabushiki Kaisha, Tokyo, Japan

[21] Appl. No.: 09/040,411

[22] Filed: Mar. 18, 1998

[30] Foreign Application Priority Data

Mar. 18, 1997 [JP] Japan ................................ 9-083386

[51] Int. Cl.[7] ...................................... H01J 17/04
[52] U.S. Cl. ........................ 313/631; 313/632; 313/491
[58] Field of Search .................... 313/491, 631, 313/632

[56] References Cited

U.S. PATENT DOCUMENTS 5,712,530  1/1998  Inoue et al. ........................ 313/631

*Primary Examiner*—Vip Patel
*Attorney, Agent, or Firm*—Sixbey, Friedman, Leedom & Ferguson; David S. Safran

[57] ABSTRACT

A discharge lamp of the short arc type with good light intensity stability in which arc fluctuation is suppressed is achieved, according to the invention by providing a discharge lamp of the short arc type which has an arc tube which surrounds the discharge space, hermetically sealed portions on the two ends of the arc tube, a cathode and an anode which are arranged opposite one another in the arc tube and which is operated such that the cathode is pointed upward, in by the cathode being supported by an inner lead which is held securely by the hermetically sealed portion, the outside diameter of the cathode being greater than the outside diameter of the inner lead, and by the relationship $L \geq 2.5D$ being satisfied, where D is the outside diameter of the cathode (mm) and L is the axial length of the cathode (mm).

3 Claims, 2 Drawing Sheets

CATHODE STRUCTURE FOR SHORT ARC TYPE DISCHARGE LAMP

BACKGROUND OF THE INVENTION

1. Field of the Invention

The invention relates to a discharge lamp of the short arc type. The invention relates especially to a discharge lamp of the short arc type which is used as the exposure light source for producing semiconductor components, liquid crystal display (LCD) elements, printed circuit boards and the like.

2. Description of Related Art

In the manufacture of semiconductor components, liquid crystal display elements, and the like, so-called photolithography is used in which a mask pattern is irradiated with UV radiation and a workpiece is exposed by this UV radiation which has passed through the mask pattern. In this photolithography, the light source is a discharge lamp of the short arc type which is subjected to vertical operation in which the cathode is pointed upward.

The arc tube of this discharge lamp is filled with emission substances such as a rare gas, mercury and the like, and mainly UV radiation is emitted. However, during lamp operation, the material which forms the anode and cathode, such as tungsten, vaporizes. This vaporized tungsten flows by the convection present in the arc tube, is usually deposited on the inner wall in the upper area of the arc tube, causes blackening and reduces the amount of UV radiation transmission.

In this case of using this discharge lamp for an exposure device and the like, radiant light is used in only one area at a predetermined angle with reference to the arc center. This area has an angle of, for example, 40° to the top and 35° to the bottom with reference to the arc center.

To eliminate this disadvantage of reduction of the amount of UV radiation transmission as a result of tungsten vaporization, an inner lead which supports the cathode is used which is longer than the inner lead which supports the anode. In this way, the cathode tip is positioned under the center of the arc tube, and thus, a larger space for the upper region of the arc tube is obtained. As a result, the upper space of the arc tube can be used outside the above described angular range.

But, in the case in which, by increasing the distance between the back end of the cathode and the hermetically sealed portion, a larger space in the upper part of the arc tube is used, undesirable turbulence of the gas occurs in the vicinity of the inner lead which supports the cathode during gas convection in the arc tube. The reason for this is that the outside diameter of the inner lead is much smaller than the outside diameter of the cathode and that the inner lead which supports the cathode is relatively long in order to position the cathode tip under the middle of the arc tube, as was described above. This turbulence of the convection gas causes turbulence during convection of all the gas in the arc tube. The arc fluctuates due to this perturbed convection and as a result the radiant light intensity becomes unstable.

The reason that the outside diameter of the inner lead is smaller than the outside diameter of the cathode is the following:

If the outside diameter of the inner lead is large, production of the hermetically sealed portion is difficult.

It is enough if the inner lead can support the cathode. It is therefore effective to reduce the thickness of the inner lead if no problem arises during support, and thus to reduce production costs.

Furthermore, the reason why the outside diameter of the cathode is smaller than the outside diameter of the inner lead is that an increase of cathode volume can increase thermal conductivity and that thus a temperature increase of the cathode can be prevented.

Especially, recently there has been a trend toward detailing the mask pattern used for photolithography. Therefore, in the case of fluctuation of the arc and unstable radiant light intensity, there is the disadvantage that exposure with high image resolution is no longer enabled.

Recently, with respect to the increase of production efficiency, there has been a demand for a discharge lamp of the short arc type with a large amount of UV radiation. Therefore, a discharge lamp of the short arc type with high input power, for example, greater than or equal to 2 kW, is used.

Accordingly, in the case of this discharge lamp of the short arc type with high input power, enlargement of the arc tube and thus of the volume of the discharge space occurs. The above described turbulence in the case of convection, therefore, becomes apparent. As a result, the disadvantage exists that the arc fluctuation and instability of light intensity continue to occur.

SUMMARY OF THE INVENTION

Therefore, a primary object of the present invention is to devise a discharge lamp of the short arc type which exhibits good stability of the radiant light intensity with arc fluctuation being suppressed.

The object of the invention is obtained in a discharge lamp of the short arc type which has an arc tube which surrounds the discharge space, hermetically sealed portions on the two ends of the arc tube, a cathode and an anode which are arranged opposite one another in the arc tube, and which is operated such that the cathode is pointed upward, by the cathode being supported by an inner lead which is held securely by the hermetically sealed portion, having an outside diameter of the cathode that is greater than the outside diameter of the inner lead, and with the relationship $L \geq 2.5D$ being satisfied where D is the outside diameter of the cathode (mm) and L is the axial length of the cathode (mm).

Furthermore, the object of the invention is achieved in a discharge lamp of the short arc type by the lamp input power being greater than or equal to 2 kW.

These and further objects, features and advantages of the present invention will become apparent from the following description when taken in connection with the accompanying drawings which, for purposes of illustration only, show a single embodiment in accordance with the present invention.

DETAILED DESCRIPTION OF THE PREFERRED EMBODIMENTS

Figure 1:
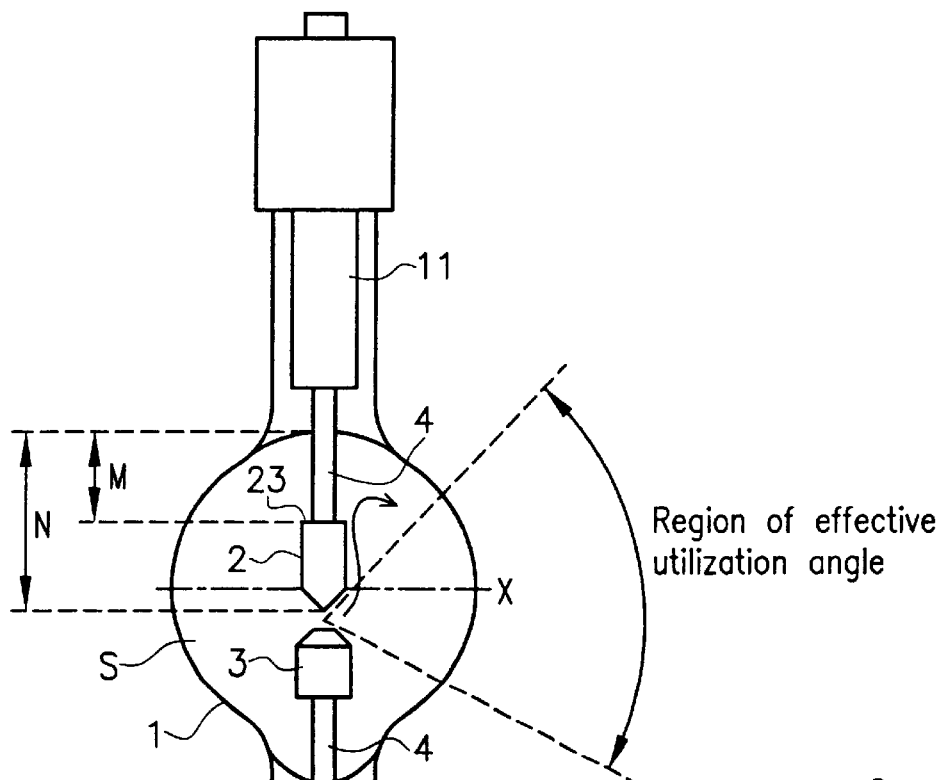
FIG. 1 is a schematic depiction of an arrangement of the discharge lamp of the short arc type in accordance with the invention.

In FIG. 1 an embodiment of a discharge lamp of the short arc type in accordance with the present invention is shown which has an arc tube which surrounds discharge space S. On each end of the arc tube 1 a hermetically sealed portion 11 is formed. In arc tube 1, a cathode 2 and an anode 3 are arranged opposite one another such that the cathode 2 is pointed upward. Cathode 2 is located along the longitudinal axis of arc tube 1 and is supported by an inner lead 4 which is held securely by a respective one of the hermetically sealed portions 11. On the other hand, anode 3 is also located along the longitudinal axis of arc tube 1 and is supported by an inner lead 4 which is held securely by the other of the two hermetically sealed portions 11. The tip of cathode 2 is positioned under the center plane X of arc tube 1.

Figure 2:
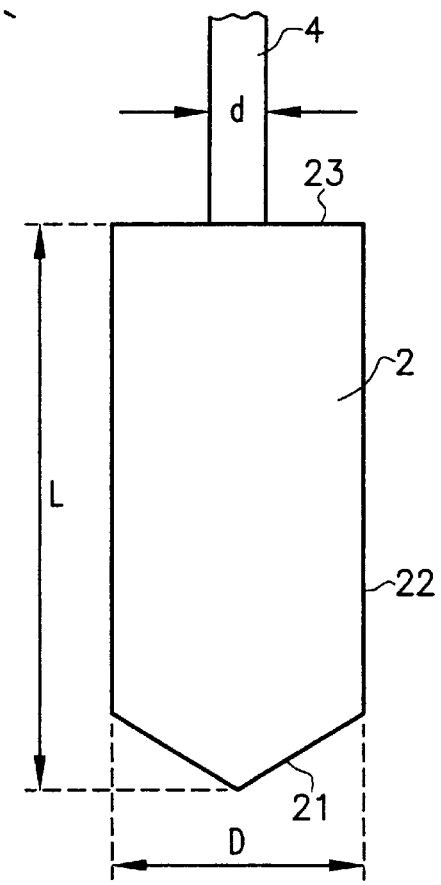
FIG. 2 schematically depicts the cathode and inner lead of FIG. 1 in an enlarged showing.

FIG. 2 is an enlarged representation of cathode 2. Cathode 2 has a conically shaped tip 21, a body 22 which is adjacent to tip 21 and which extends axially with a uniform outside diameter, and a rear end 23 which is formed on the side of body 22 facing the hermetically sealed portion. Inner lead 4 is positioned in the middle of the rear end 23.

Inner lead 4 and cathode 2 can also be formed of a one piece construction. Here, the term "inner lead 4" is defined as the region of the extension from hermetically sealed portion 11 into arc tube 1 as far as the point on which the cathode 2 is formed which has an outside diameter which is greater than the outside diameter of this inner lead 4.

In this case, the outside diameter D of cathode 2 is greater than the outside diameter d of inner lead 4. Furthermore, the relation between outside diameter D (mm) of cathode 2 and axial length L (mm) of the cathode 2 is represented by $L \geq 2.5D$. This means that the length of cathode 2 in the axial direction is at least 2.5 times greater than its outside diameter. The reason for this numerical value is described using the experiment described below.

Arc tube 1 is filled with a rare gas, such as xenon, argon, krypton and the like or a mixture thereof and mercury as the discharge emission substance. It is filled, for example, with 0.1 atm to 10 atm of gas. The mercury filling amount is, for example, 0.5 mg/cc to 60 mg/cc of inside volume of arc tube 1.

Here, it is desirable for the outside diameter D of the cathode 2 to be 8 mm to 20 mm. The reason for this lies in the following:

In the case of outside diameter D of cathode 2 of less than 8 mm, the thermal conductivity is adversely affected; this causes a high temperature at the tip of cathode 2. As a result, vaporization of the electrode material which forms cathode 2 becomes vigorous. Furthermore, in the case of outside diameter D of cathode 2 of greater than 20 mm, there is the disadvantage that electrode manufacture becomes difficult.

Consequently, the relation between outside diameter D (mm) and length (L) of cathode 2 in the axial direction is represented by $L \geq 2.5D$. It is, therefore, desirable that the axial length L of cathode 2 is 20 mm to 50 mm.

In the discharge lamp of the short arc type according to the invention, the body 22 of the cathode 2 can be made relatively long by the axial length of the cathode 2 being at least 2.5 times greater than the outside diameter of the cathode. Therefore, the gas flow within the arc tube along the surface of body 22 can be guided and straightened.

Furthermore, the space between the rear end 23 and hermetically sealed portion 11 can be narrowed because the rear end 23 of cathode 2 approaches the end of the hermetically sealed portion 11 of arc tube 1.

This means that, in upward gas flow within arc tube 1 along the cathode 2, no undesirable turbulence of this gas occurs in the vicinity of the thinner inner lead 4. Nor does any turbulence occur in the convection of the gas within arc tube 1. Therefore, fluctuation of the arc can be suppressed and the radiant light intensity stabilized.

Furthermore, it has been confirmed that, for operation with a lamp power of greater than or equal to 2 kW, the stability of the radiant light intensity of this discharge lamp of the short arc type is much better than the light intensity stability of a conventional discharge lamp of the short arc type.

In the following, a discharge lamp of the short arc type in accordance with the invention is described using several embodiments:

(Embodiment 1)

According to the arrangement shown in FIG. 1, a discharge lamp of the short arc type according to the invention was produced having the following specifications:

Arc tube 1:
Material: quartz glass
Volume of discharge space: 80 cc
Cathode 2:
Material: thoriated tungsten
Dimensions: Outside diameter D: 10 mm
 Length L in the axial direction: 25 mm
Anode 3:
Material: tungsten
Dimensions: Outside diameter D: 20 mm
 Length in the axial direction: 30 mm
Inner lead 4 which supports the cathode:
Material: tungsten
Dimensions: Outside diameter d: 6 mm
Distance N between hermetically sealed portion 11 and the tip of cathode 2: 40 mm
Distance M between hermetically sealed portion 11 and back end 23 of cathode 2: 15 mm
Distance between electrodes: 5 mm
Filled substance: xenon gas (pressure during filling is 0.5 atm), 2 g of mercury
Rated current: 55 A
Rated voltage: 36 V
Rated input power: 1980 W
Light intensity stability: 0.48

The term "light intensity stability" is defined as the fluctuation of the arc represented by numerical values computed using the following formula, the discharge lamp of the short arc type in embodiment 1 having been operated in such a way that the cathode is pointed upward, and the illuminance of the UV radiation having been measured at a point away from the arc center in the horizontal direction:

$$\text{Mod} = \{(I_{max} - I_{min})/((I_{max} + I_{min})/2)\} \times 100 \qquad \text{(Equation 1)}$$

Mod . . . light intensity stability
$I_{max}$ . . . maximum illuminance (W/cm$^2$)
$I_{min}$ . . . minimum illuminance (W/cm$^2$)

EXPERIMENTAL EXAMPLE 1

As is shown below using Table 1, different discharge lamps of the short arc type were produced for comparison purposes, in which outside diameter D of the cathode and axial length L of the cathode differ from those of the lamp in embodiment 1 and their light intensity stability was determined. Table 1 shows the results, the results for the lamp in embodiment 1 also being shown.

TABLE 1

| Specimen Number | L/D | Light Intensity Stability | Cathode Length L (mm) | Outside Diameter D of Cathode (mm) |
|---|---|---|---|---|
| Comparison Lamp 1 | 0.5 | 1.41 | 4 | 8 |
| Comparison Lamp 2 | 0.5 | 1.45 | 5 | 10 |
| Comparison Lamp 3 | 0.5 | 1.44 | 6 | 12 |
| Comparison Lamp 4 | 1.0 | 1.16 | 8 | 8 |
| Comparison Lamp 5 | 1.0 | 1.21 | 10 | 10 |
| Comparison Lamp 6 | 1.0 | 1.12 | 12 | 12 |
| Comparison Lamp 7 | 1.5 | 0.84 | 12 | 8 |
| Comparison Lamp 8 | 1.5 | 0.80 | 15 | 10 |
| Comparison Lamp 9 | 1.5 | 0.82 | 18 | 12 |
| Comparison Lamp 10 | 2.0 | 0.55 | 16 | 8 |
| Comparison Lamp 11 | 2.0 | 0.56 | 20 | 10 |
| Comparison Lamp 12 | 2.0 | 0.52 | 24 | 12 |
| Comparison Lamp 13 | 2.5 | 0.48 | 20 | 8 |
| Lamp In Embodiment 1 | 2.5 | 0.48 | 25 | 10 |
| Comparison Lamp 14 | 2.5 | 0.47 | 30 | 12 |
| Comparison Lamp 15 | 3.0 | 0.48 | 24 | 8 |
| Comparison Lamp 16 | 3.0 | 0.47 | 30 | 10 |
| Comparison Lamp 17 | 3.0 | 0.47 | 36 | 12 |
| Comparison Lamp 18 | 4.0 | 0.47 | 32 | 8 |

Table 1 shows that, in comparison lamps 13 through 18 and in the lamp in embodiment 1, the light intensity stability is high, i.e. the value of the light intensity stability is less than 0.5 and the arc fluctuation is suppressed.

This shows that the light intensity stability is good and arc fluctuation is suppressed when $L/D \geq 2.5$, i.e. when $L \geq 2.5/D$.

Figure 3:
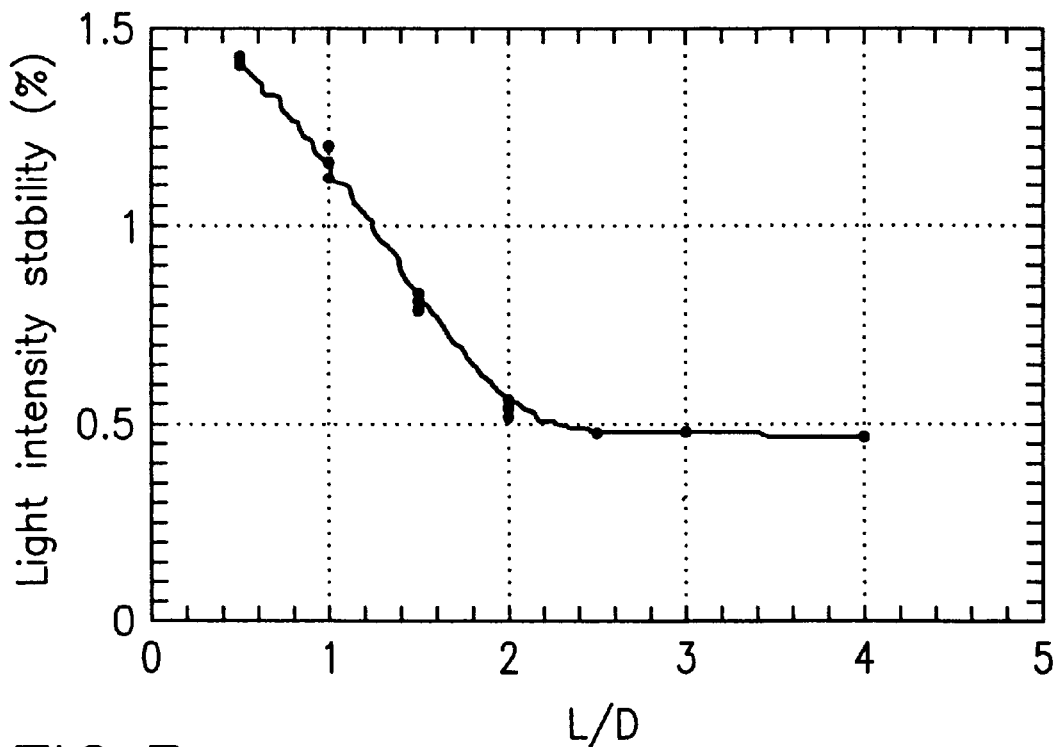
FIG. 3 a graph plotting data which represent the relation L/D between the outside diameter D of the cathode and the axial length L of the cathode in relation to the change of the light intensity stability.

FIG. 3 shows graphically the change of light intensity stability with reference to the value of L/D. As is apparent from this graph, the light intensity stability is good and arc fluctuation is suppressed when $L/D \geq 2.5$, i.e. when $L \geq 2.5D$.

EXPERIMENTAL EXAMPLE 2

Table 2 shows the degree of improvement of the light intensity stability in the case of changes of the lamp input power for the lamp according to the invention relative to a conventional lamp with a different ratio between the outside diameter D of the cathode and axial length L of the cathode.

The "degree of improvement of light intensity stability" was determined by substituting the value of light intensity stability of the respective lamp, which was determined using the aforementioned equation 1, into the following equation:

$$E_{va} = \{(Mod_0 - Mod_1)/Mod_0\} \times 100 \quad \text{(Equation 2)}$$

$E_{va}$ . . . degree of improvement (%)
$Mod_0$ . . . light intensity stability of conventional lamp
$Mod_1$ . . . light intensity stability of lamp as claimed in the invention

TABLE 2

| | Convention Lamp | | Lamp of Invention | | Degree of |
|---|---|---|---|---|---|
| Lamp Input Power (kW) | Intensity (L/D) | Light Stability | Intensity (L/D) | Light Stability | Improvement (%) |
| 1.0 | 1.8 | 0.49 | 2.5 | 0.44 | 10.2 |
| 1.2 | 1.8 | 0.50 | 2.5 | 0.44 | 11.8 |
| 1.5 | 1.8 | 0.59 | 2.5 | 0.47 | 20.2 |
| 1.8 | 1.8 | 0.75 | 2.5 | 0.48 | 35.8 |
| 2.0 | 1.8 | 0.82 | 2.5 | 0.48 | 41.5 |
| 2.5 | 1.8 | 0.87 | 2.5 | 0.51 | 41.5 |
| 3.0 | 1.8 | 0.86 | 2.5 | 0.50 | 42.0 |
| 4.0 | 1.8 | 0.90 | 2.5 | 0.53 | 41.0 |
| 8.0 | 1.8 | 0.89 | 2.5 | 0.52 | 41.5 |
| 10.0 | 1.8 | 0.86 | 2.5 | 0.51 | 41.0 |

Table 2 shows that, at each lamp input power, the lamp according to the invention has better light intensity stability, if at the same lamp input power, the light intensity stability of the conventional lamp is compared to the light intensity stability of the lamp according to the invention. Here, it becomes apparent that, especially in the case of a lamp input power of at least 2 kW, the light intensity stability of the lamp in accordance with the invention was improved by at least 40% with reference to the light intensity stability of the conventional lamp, and that the arc fluctuation was suppressed.

Figure 4:
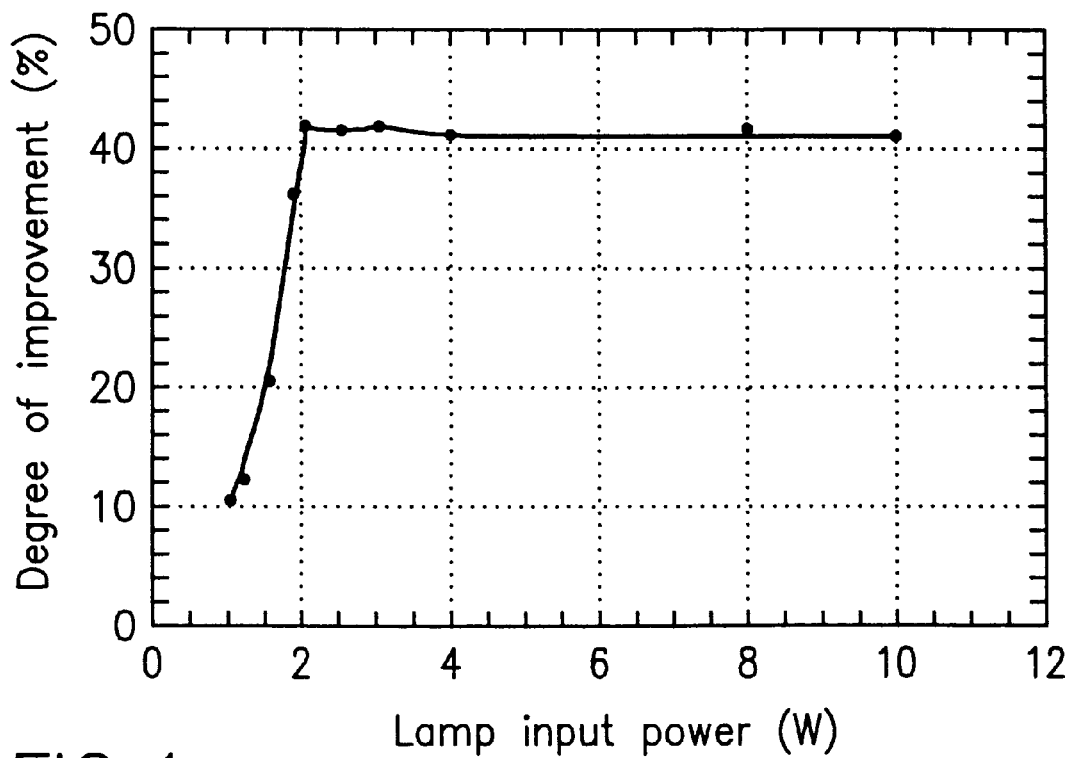
FIG. 4 is a graph of data which represent the degree of improvement of the light intensity stability of the discharge lamp of the short arc type of the invention with reference to the stability of a conventional discharge lamp of the short arc type.

FIG. 4 is a graphic representation of the degree of improvement with respect to the lamp input power. As is apparent from FIG. 4, the degree of improvement is greater than or equal to 40% if the lamp input power is greater than or equal to 2 kW. This shows that the stability of the lamp of the invention is much better than the stability of a conventional lamp, and that arc fluctuation is suppressed.

Action of the Invention

In the discharge lamp of the short arc type according to the invention, a greater length of the cathode in the axial direction is achieved by the axial length of the cathode being at least 2.5 times as great as the outside diameter of the cathode. Therefore, the gas flow along the surface of this lengthened cathode can be guided and straightened.

The space between the rear end of the cathode and the hermetically sealed portion can be reduced by the rear end of the cathode approaching the end of the hermetically sealed portion of the arc tube.

When the gas flows upward along the cathode within the arc tube, this prevents the gas from being turned in a direction toward the thinner inner lead. Furthermore, turbulence in the convection of all of the gas within the arc tube is suppressed. Therefore, arc fluctuation can be suppressed and the light intensity stability is improved.

For operation of the above described discharge lamp of the short arc type with a lamp input power of greater than or equal to 2 kW, the light intensity stability of the discharge lamp of the short arc type with the above described arrangement is much better than the light intensity stability of a conventional discharge lamp of the short arc type.

Therefore, a discharge lamp of the short arc type with a large amount of UV radiation can be obtained and the exposure efficiency and production efficiency increased.

What we claim is:

1. A discharge lamp of the short arc type having an arc tube which surrounds a discharge space, hermetically sealed portions on opposite ends of the arc tube, and a cathode and an anode which are arranged opposite one another in the arc tube; wherein the cathode is supported by an inner lead which is held securely by one of the hermetically sealed portions; wherein an outside diameter of the cathode is greater than an outside diameter of the inner lead; and wherein the relationship $L \geq 2.5D$ is satisfied, where D is the outside diameter of the cathode (mm) and L is the axial length of the cathode (mm).

2. Discharge lamp of the short arc type as claimed in claim 1, comprising a lamp input power source providing a lamp input power of at least 2 kW.

3. A method of producing UV light, from a discharge lamp of the short arc type, which exhibits good stability of the radiant light intensity with arc fluctuation being suppressed comprising the steps of providing a discharge lamp of the short arc type having an arc tube which surrounds the discharge space, hermetically sealed portions on opposite ends of the arc tube, a cathode and an anode which are arranged opposite one another in the arc tube; wherein the cathode is supported by an inner lead which is held securely by one of the hermetically sealed portions; wherein an outside diameter of the cathode is greater than an outside diameter of the inner lead; and wherein the relationship $L \geq 2.5D$ is satisfied, where D is the outside diameter of the cathode (mm) and L is the axial length of the cathode (mm); comprising the steps of arranging lamp with the cathode pointed upward, and supplying an input power to the lamp of at least 2 kW.

* * * * *